United States Patent [19]
Ohnuma et al.

[11] Patent Number: 5,290,197
[45] Date of Patent: Mar. 1, 1994

[54] METHOD FOR MOUNTING A WIRING BOARD ON A LIQUID CRYSTAL DISPLAY SUBSTRATE

[75] Inventors: Yoshinao Ohnuma, Nara; Yasunobu Tagusa, Ikoma, both of Japan

[73] Assignee: Sharp Kabushiki Kaisha, Osaka, Japan

[21] Appl. No.: 974,902

[22] Filed: Nov. 12, 1992

[30] Foreign Application Priority Data

Nov. 18, 1991 [JP] Japan .................................. 3-301808

[51] Int. Cl.⁵ .......................................... H01L 23/28
[52] U.S. Cl. .................. 445/24; 264/272.17; 29/841
[58] Field of Search ............ 445/24; 264/272.13, 264/272.14, 272.17; 29/841

[56] References Cited

U.S. PATENT DOCUMENTS 3,693,252 9/1972 Robertson et al. ............. 29/841
4,643,526 2/1987 Watanabe et al. .

FOREIGN PATENT DOCUMENTS 52-113198 9/1977 Japan .
60-238817 11/1985 Japan .
60-220317 5/1987 Japan .

OTHER PUBLICATIONS

IBM Technical Disclosure Bulletin, vol. 33, No. 7, Dec. 1990, New York, US, p. 213 "direct Chip Bonding for Liquid Crystal Display".
Derwent AN: 86-001771.

*Primary Examiner*—Kenneth J. Ramsey
*Attorney, Agent, or Firm*—Nixon & Vanderhye

[57] ABSTRACT

A method for mounting a semiconductor chip on a first wire board, bonding a second wire board to a connecting terminal of the first wire board with a thermo-setting layer of anisotropic conductivity, covering the undersurface and periphery of the semiconductor chip by a first thermo-setting epoxy resin so as to embed and seal the semiconductor chip therein, and cover the connecting part of the first wire board and the second wire board by a second thermo-setting epoxy resin.

8 Claims, 2 Drawing Sheets

METHOD FOR MOUNTING A WIRING BOARD ON A LIQUID CRYSTAL DISPLAY SUBSTRATE

BACKGROUND OF THE INVENTION

1. Field of the Invention

The present invention relates to a method for mounting a wire board on a liquid crystal display substrate so as to connect the display substrate to a semiconductor chip, a flexible wire board, and other surfaces. Hereinafter, the liquid crystal display will be referred to as "LCD."

2. Description of the Related Art

Under common practice a semiconductor chip for driving the liquid crystals in a display substrate is bonded face-down to the display substrate with an electrically-conductive adhesive or a solder.

In general, as shown in FIG. 6 an LCD apparatus is provided with an LCD substrate 21 and a counter glass substrate 31 bonded to each other with a liquid crystal layer (not shown) sandwiched therebetween. The LCD substrate 21 is provided with a wiring pad 22 and a connecting terminal 28 through which a semiconductor chip 24 and a flexible wire board 26 are connected to the LCD substrate 21.

A typical example of the known method of mounting the semiconductor chip 24 and the flexible wire board 26 on the LCD substrate 21 will be described by reference to FIG. 6:

The semiconductor chip 24 is provided with bump electrodes 23 on the undersurface thereof. The bump electrodes 23 are bonded to the wiring pads 22 and one of the connecting terminals 28 by use of an electrically-conductive adhesive 25. The reliability against water of the connecting points of the bump electrode 23 to the wiring pad 22 and the connecting terminal 28, respectively is low. Therefore, a thermosetting epoxy resin 30 is then injected through a gap between the counter glass substrate 31 and the semiconductor chip 24 until the epoxy resin 30 covers from a lower part of the semiconductor chip 24 up to the sides thereof due to capillarity. This method has advantages, in that the semiconductor chip 24 is embedded in the resin 30 and sealed to the substrate 21, and that on the side of the semiconductor chip 24 near the connecting terminal 28 a fillet 32 is formed. The fillet 32 prevents water from entering the connecting points through the interface between the epoxy resin 30 and the LCD substrate 21.

The thermo-setting epoxy resin 30 is preferably a type which exhibits good wettability with the LCD substrate 21. The length of the fillet 32 depends upon the amount of supply of the resin 30.

Subsequently, the flexible wire board 26 is bonded to that side of the connecting terminal 28 which is opposite to the semiconductor chip 24 through a thermoplastic layer 27 of anisotropic conductivity which permits reworking. Then, the connecting part 34 of the flexible wire board 26 is covered with a silicon resin coat 33 so as to protect it against water. In this way the mounting method is finished.

However, the above-mentioned known mounting method has disadvantages; one is that because of the use of a thermoplastic layer 27 of anisotropic conductivity, no heat can be applied after the flexible wire board 26 is bonded to the LCD substrate 21. Therefore, before the flexible wire board 26 is bonded to the substrate, the semiconductor chip 24 is sealed in epoxy resin 30. A fillet 32 is thus formed in which it is difficult to control the length. As a result, the connecting part 34 of the LCD substrate 21 and the flexible wire board 26 are detrimentally sealed in a flooded epoxy resin 30.

In order to avoid such problems, it is required to keep the pads 22 and the connecting part 34 of the flexible wire board 26 at a relatively large distance. This results in increasing the size of the LCD substrate 21.

A proposed solution to the flooding problem of epoxy resin 30 is a dam by means of a heat-proof tape in the connecting terminal. However, this method presents at least two problems; one is that the number of production steps is increased, and the other is that the remainder of the dam is likely to spoil the adherence of the silicon resin coat 33 with the connecting terminal 28. This leads to a poor electrical connection at the connecting part 34 of the flexible wire board 26.

In general, the silicon resin 33 is of two types; one is a condensation type resin (merely condensation resin) and the other is an addition type resin (merely addition resin). Addition silicon resins are superior to condensation silicon resins in antihumidity, but a problem is that the addition resin is difficult to harden sufficiently when it comes into contact with any resin containing an amine-type hardener.

In practise, since the thermoplastic layer 27 of anisotropic conductivity and the thermo-setting epoxy resin 30 both contain an amine-type hardener, an addition resin cannot be used, and as a substitute, the condensation type must be used. As a result, the favorable antihumidity property of the addition resin cannot be utilized.

SUMMARY OF THE INVENTION

The method of this invention in which a semiconductor chip and a wire board are mounted on a substrate having a first connecting terminal for mounting the semiconductor chip and a second connecting terminal for connection to a wire board, includes the steps of electrically connecting electrodes of the semiconductor chip to the first connecting terminal and the second connecting terminal; bonding the wire board to the second connecting terminal through a thermosetting layer of anisotropic conductivity; filling gaps present between the LCD substrate and the semiconductor chip with a first thermo-setting epoxy resin so as to seal the first connecting terminal therein; filling the connecting part of the wire board to the second connecting terminal with a second thermo-setting epoxy resin so as to cover the connecting part therein; and hardening the first and second thermo-setting epoxy resins by heat.

Thus, the invention described herein makes possible the advantages of providing a method for mounting a semiconductor chip, flexible wire board and other devices on a substrate, the method ensuring a compact-size LCD apparatus with the reliability and anti-humidity of each connecting part.

These and other advantages of the present invention will become apparent to those skilled in the art upon reading and understanding the following detailed description with reference to the accompanying FIGURES.

DESCRIPTION OF THE PREFERRED EMBODIMENTS

FIGS. 1 to 5 show an exemplary embodiment by which a semiconductor chip and a flexible wire board (2nd wire board) are bonded to an LCD board (1st wire board).

Figure 1:
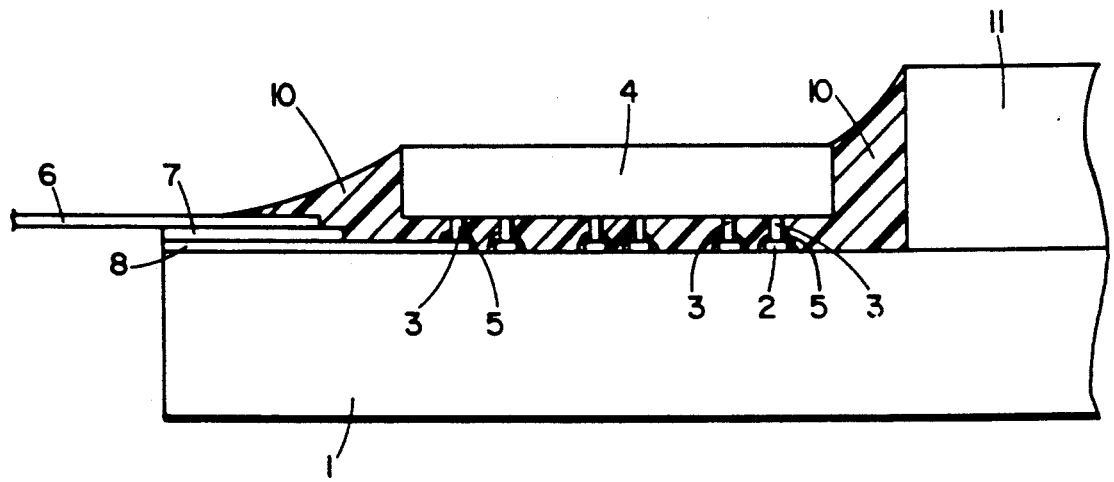
FIG. 1 is a schematic view exemplifying the connection of a semiconductor chip and a flexible wire board to an LCD substrate under the coverage of thermo-setting epoxy resin.
Figure 2:
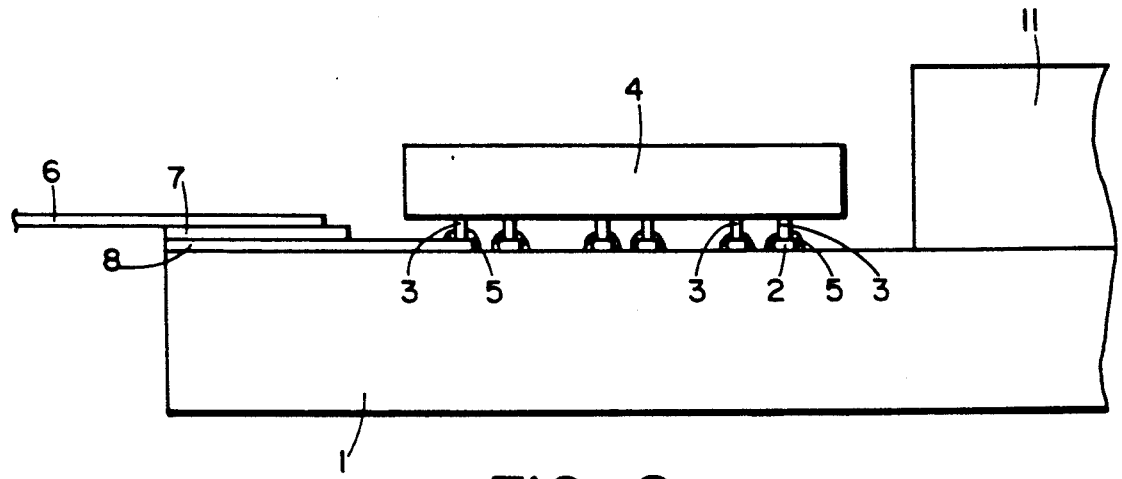
FIG. 2 is a schematic view showing the connecting parts of the semiconductor chip and the flexible wire board to the LCD substrate shown in FIG. 1.

As shown in FIG. 2, the LCD substrate 1 has a counter glass substrate 11 bonded thereto with a liquid crystal layer (not shown) sandwiched therebetween. The LCD substrate 1 is provided with a connecting terminal 8 and a plurality of wiring pads 2 on an extended portion thereof. The semiconductor chip 4 is provided with bump electrodes 3 on its undersurface. The bump electrodes 3 are bonded to the wiring pads 2 by use of an electrically-conductive adhesive 5 or a solder.

Then, one end of the flexible wire board 6 is overlaid on the LCD substrate 1 with the electrically-conductive adhesive 7 and the connecting terminal 8 therebetween. The end of the flexible wire board 6 is then bonded to the connecting terminal 8 via the electrically-conductive adhesive 7 by heating and pressing from the top thereof. The electrically-conductive adhesive 7 contains a thermo-setting resin including a predetermined amount of conductive particles in dispersion. The electrically-conductive adhesive 7 is softened by the heat to be caused a flow therein or therefrom and then is hardened again.

Figure 3:
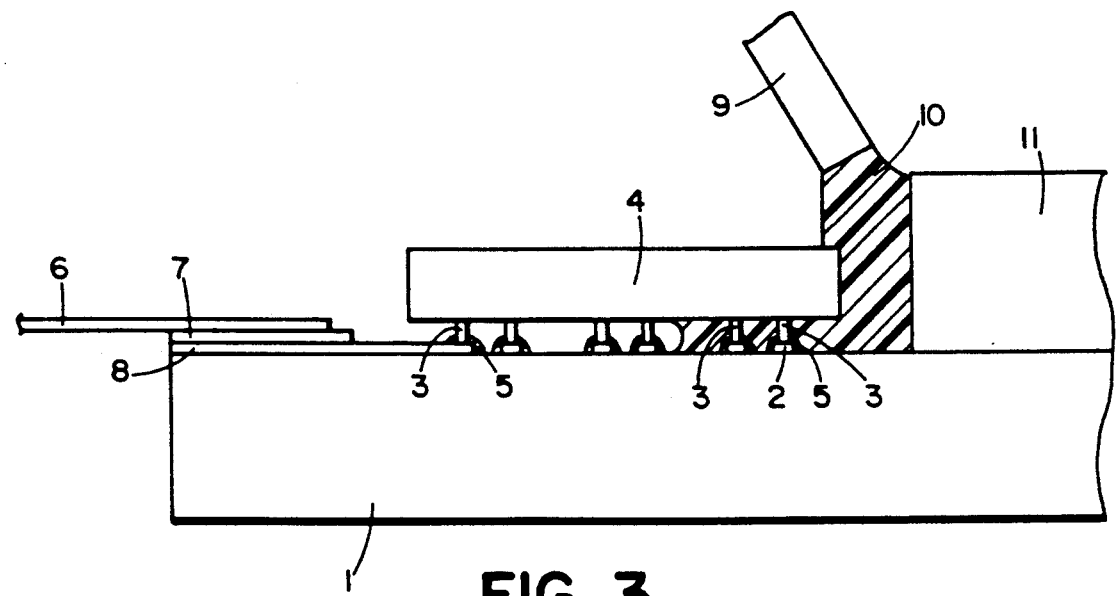
FIG. 3 is a schematic view showing a state where the semiconductor chip is embedded and sealed in the thermo-setting epoxy resin.

As shown in FIG. 3, the thermo-setting epoxy resin 10 is introduced into a gap between the counter glass substrate 11 and the semiconductor chip 4 by means of a needle 9. The injected epoxy resin 10 spreads and reaches beneath the semiconductor chip 4 due to capillarity. At this stage, the LCD substrate 1 is preferably heated so that the epoxy resin becomes fluid and spreads easily.

Figure 4:
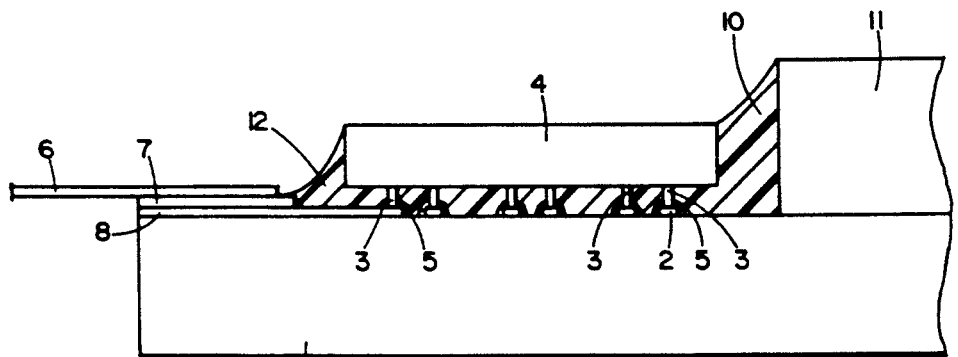
FIG. 4 is a schematic view showing a state where the semiconductor chip is embedded and sealed in the thermo-setting epoxy resin.
Figure 5:
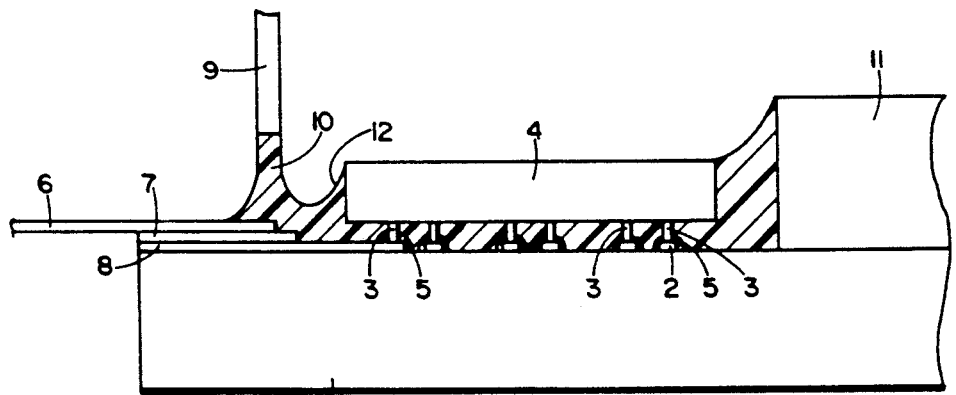
FIG. 5 is a schematic view showing a state where the thermo-setting epoxy resin is coated on the connecting part of the flexible wire board 6.
Figure 6:
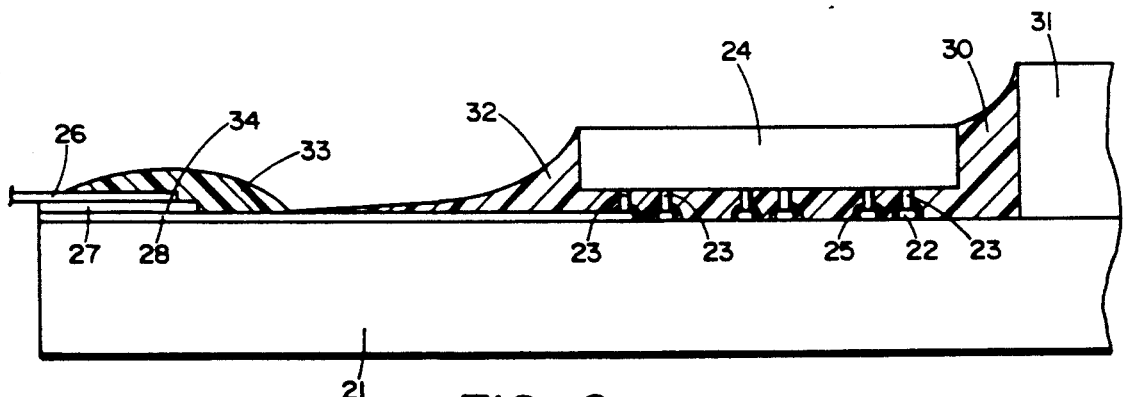
FIG. 6 is a schematic view exemplifying a known mounting method of connecting a semiconductor chip and a flexible wire board to an LCD substrate under the coverage of thermo-setting epoxy resin.

Then, as shown in FIG. 4, the epoxy resin 10 is allowed to flow and reach the periphery of the semiconductor chip 4 so that the semiconductor chip 4 is embedded and sealed in the epoxy resin 10. In addition, the epoxy resin 10 is allowed to form a fillet 12 which prevents water from entering the connecting points of the bump electrode 3 to the wiring pad 2 and the connecting terminal 8, respectively through the interface of the LCD substrate 1.

Then, as shown in FIG. 5 the needle 9 is again used to inject thermo-setting epoxy resin 10 so as to cover a forward end portion of the flexible wire board 6 and the fillet 12, and heat is applied to the epoxy resin 10 so as to harden it. Moreover, passages of water to the connecting points of the bump electrode 3 to the wiring pad 2 and the connecting terminal 8 are made much longer. The reliability of the connecting points against water is thus improved.

In this way, the semiconductor chip 4 and the flexible wire board 6 are bonded to the LCD substrate 1 at desired places thereof, and they are embedded and sealed in the thermo-setting epoxy resin 10.

According to the method described above, the bonding of the flexible wire board 6 to the connecting terminal 8 is finished before the semiconductor chip 4 is embedded and sealed in the epoxy resin 10.

As a result, the flooded epoxy resin 10 is prevented from detrimentally covering the connecting parts of the connecting terminal 8 and the flexible wire board 6. This allows the freedom of subsequent working; for example, the distance between the semiconductor chip 4 and the connecting part of the flexible wire board 6 can be restricted to the total length of a required length of the fillet 12 and a length over which the thermo-setting layer 7 of anisotropic conductivity flows. Thus, the LCD substrate 1 can be shortened, thereby resulting in a compact-size display apparatus.

According to the present invention, one advantage is that it is not necessary to form a dam designed to prevent the epoxy resin 10 from flooding, thereby reducing the number of steps for fabricating the LCD devices. In addition, it is possible to avoid any problem possibly occurring from a remainder of the heat-proof tape on the connecting terminal 8. Another advantage is that the thermo-setting epoxy resin 10 covering the LCD substrate 1 and the flexible wire board 6 protects them against moisture.

Various other modifications will be apparent to and can be readily made by those skilled in the art invention. Accordingly, it is not intended that the scope of the claims appended hereto is limited to the description as set forth herein, but rather that the claims be broadly construed.

What is claimed is:

1. A method for mounting a semiconductor chip and a wire board on a liquid crystal display substrate having a first connecting terminal for the semiconductor chip and a second connecting terminal for the wire board and the semiconductor chip, the method comprising the steps of:

electrically connecting electrodes of the semiconductor chip to the first connecting terminal and to a first end of the second connecting terminal;

bonding the wire board to a second end of the second connecting terminal through a thermo-setting layer of anisotropic conductivity; then filling gaps present between the liquid crystal display substrate and the semiconductor chip with a first application of a thermo-setting epoxy resin so as to seal the first connecting terminal therein;

filling the connecting part of the wire board to the second connecting terminal with a second application of a thermo-setting epoxy resin so as to cover the connecting part therein, the first and second applications of the resins resulting in a substantially continuous flow of the resins between the semiconductor chip and the wire board; and hardening the first and second applications of the thermo-setting epoxy resins by heat.

2. A method according to claim 1, wherein the step of sealing the first connecting terminal with thermo-setting epoxy resin includes the step of filling around the semiconductor chip with thermo-setting epoxy resin.

3. A method according to claim 1, wherein the liquid crystal display substrate comprises a counter glass substrate and a liquid crystal layer sandwiched therebetween.

4. A method according to claim 3 wherein the step of sealing the first connecting terminal in thermo-setting epoxy resin includes the step of filling gaps between the pair of glass substrates and the semiconductor chip with thermo-setting epoxy resin.

5. A method according to claim 1, wherein the same kind of thermo-setting epoxy resin is used to seal the first connecting terminal and cover the connecting part of the wire board to the second connecting terminal.

6. A method according to claim 1, wherein the thermosetting layer of anisotropic conductivity is made of a composition containing thermo-setting resin and conductive particles.

7. A method for mounting a semiconductor chip and a wire board on a liquid crystal display substrate comprising a counter glass substrate and a liquid crystal layer sandwiched between the liquid crystal display substrate and the glass substrate, and the liquid crystal display substrate having, on an edge, a first connecting terminal for bearing the semiconductor chip and a second connecting terminal for the semiconductor chip which is provided outside of the first connecting terminal, the method comprising the steps of:
   electrically connecting bump electrodes of the semiconductor chip to the first connecting terminal and one end of the second connecting terminal to form a gap between the liquid crystal display substrate and the semiconductor chip;
   electrically connecting the wire board to the other end of the second connecting terminal through a thermo-setting layer of anisotropic conductivity; then
   introducing a first thermo-setting epoxy resin from a gap formed between the counter glass substrate and the semiconductor chip into the gap between the liquid crystal display substrate and the semiconductor chip so as to seal the first connecting terminal therein and provide a first application of the first thermo-setting epoxy resin around the semiconductor chip;
   filling the connecting part of the wire board to the second connecting terminal with a second application of a second thermo-setting epoxy resin so as to cover the connecting part therein, the first and second applications of the resins resulting in a substantially continuous flow of the resins between the semiconductor chip and the wire board; and
   hardening the fist and second applications of the thermo-setting epoxy resins by heat.

8. A method for mounting a semiconductor chip and a wire board on a liquid crystal display substrate comprising a counter glass substrate and a liquid crystal layer sandwiched between the liquid crystal display substrate and the glass substrate, and the liquid crystal display substrate having, on an edge, a first connecting terminal provided at a position outside of the glass substrate so as to bear the semiconductor chip and a second connecting terminal for the semiconductor chip which is provided outside of the first connecting terminal, the method comprising the steps of:
   electrically connecting pump electrodes of the semiconductor chip to the fist connecting terminal and the inner end of the second connecting terminal to form a gap between the liquid crystal display substrate and the semiconductor chip;
   electrically connecting the wire board to an outer end of the second connecting terminal through a thermo-setting layer of anisotropic conductivity; then
   introducing a first thermo-setting epoxy resin into the gap formed between the liquid crystal display substrate and the semiconductor chip so as to seal the first connecting terminal therein;
   filling the connecting part of the wire board to the second connecting terminal with a second application of a second thermo-setting epoxy resin so as to cover the connecting part therein, the first and second applications of the resins resulting in a substantially continuous flow of the resins between the semiconductor chip and the wire board; and
   hardening the first and second applications of the thermo-setting epoxy resins by heat.

* * * * *